(12) United States Patent
Hasegawa

(10) Patent No.: US 7,764,073 B2
(45) Date of Patent: Jul. 27, 2010

(54) ELECTRICAL CONNECTING APPARATUS

(75) Inventor: Yoshiei Hasegawa, Kanagawa (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 524 days.

(21) Appl. No.: 11/910,523

(22) PCT Filed: Apr. 18, 2005

(86) PCT No.: PCT/JP2005/007736

§ 371 (c)(1),
(2), (4) Date: Oct. 2, 2007

(87) PCT Pub. No.: WO2006/114885

PCT Pub. Date: Nov. 2, 2006

(65) Prior Publication Data

US 2009/0061658 A1    Mar. 5, 2009

(51) Int. Cl.
*G01R 31/02* (2006.01)
(52) U.S. Cl. .......................................... 324/754; 439/71
(58) Field of Classification Search ......... 324/754–765, 324/158.1; 439/66–79
See application file for complete search history.

(56) References Cited

U.S. PATENT DOCUMENTS

| 7,255,575 | B2 * | 8/2007 | Hasegawa | 439/71 |
| 7,458,818 | B2 * | 12/2008 | Kiyofuji et al. | 439/66 |
| 7,667,472 | B2 * | 2/2010 | Miura et al. | 324/754 |

FOREIGN PATENT DOCUMENTS

| JP | 06-140484 | 5/1994 |
| JP | 11-003754 | 1/1999 |
| JP | 11-160356 | 6/1999 |
| JP | 2000-028640 | 1/2000 |
| JP | 2001-183392 | 7/2001 |
| WO | WO 91/11039 | 7/1991 |

* cited by examiner

*Primary Examiner*—Ha Tran T Nguyen
*Assistant Examiner*—Arleen M Vazquez
(74) *Attorney, Agent, or Firm*—Ingrassia Fisher & Lorenz, P.C.

(57) ABSTRACT

The electrical connecting apparatus comprises: a wiring base plate having a first surface provided with a plurality of first conductive portions; a probe base plate having a second surface provided with a plurality of second conductive portions with its second surface opposed to the lower surface; a plurality of screws for removably coupling the wiring base plate and the probe base plate; and a connecting device for electrically connecting the first and second conductive portions.

15 Claims, 14 Drawing Sheets

ELECTRICAL CONNECTING APPARATUS

TECHNICAL FIELD

The present invention relates to an electrical connecting apparatus such as a probe card for electrically connecting an integrated circuit as a device under test and an electric circuit of its inspection apparatus.

BACKGROUND

There is one electrical connecting apparatus of this type comprising a so-called probe base plate made of ceramic and a resin layer disposed on one surface side of the probe base plate, with a plurality of contacts formed in the resin layer (Patent Documents 1 and 2).

Patent Document 1: Japanese Patent Appln. Public Disclosure No. 6-140484
Patent Document 2: Japanese Patent Appln. Public Disclosure No. 11-160356

In the invention described in Patent Document 1, a resin layer is a multilayered wiring layer with wirings, contacts and the like formed on a probe base plate by photolithography technique; therefore, the resin layer is adhered to the probe base plate.

In the invention described in Patent Document 2, a probe base plate is a multilayered wiring base plate having a plurality of wirings. A resin layer is made by forming a plurality of holes in a film with a resin thin film and a copper thin film laminated, embedding a metal material in those holes by electroplating to serve as contacts, and removing unnecessary parts of the copper thin film by etching. The resin layer is adhered to the probe base plate by anisotropic conductive rubber sheet.

Electrodes of the integrated circuit as a device under test are different in position, function, size, arrangement pitch and the like, depending on kinds of the integrated circuits.

However, both of the above-mentioned conventional techniques necessitate to manufacture the probe base plates difficult to produce and prepare for each type of integrated circuit, so that the probe base plate itself becomes expensive.

BRIEF SUMMARY

An object of the present invention is to realize standardization of a probe base plate and provide a probe base plate at a reasonable cost.

The electrical connecting apparatus according to the present invention comprises: a wiring base plate having a first surface with a plurality of first conductive portions; a probe base plate having a second surface with a plurality of conductive portions, the second surface being opposed to the first surface; a plurality of screw members combining detachably the wiring base plate and the probe base plate; and a connecting device for electrically connecting the first and the second conductive portions.

The connecting device in the electrical connecting apparatus according to the present invention includes: a first sheet-like member having on one surface a plurality of first wirings electrically connected to the first conductive portions, the first sheet-like member being disposed such that the first wirings extend in a first direction intersecting the first and second surfaces between the wiring base plate and the probe base plate; a second sheet-like member having on one face a plurality of second wirings electrically connected to the second conductive portion, the second sheet-like member being disposed such that the second wirings are opposed to the first wirings and extend in the first direction between the wiring base plate and the prove base plate; and a pressing device for displacing the first and second sheet-like members relatively in the second direction intersecting the first direction within a surfaces parallel to the first and second surfaces between the wiring base plate and the probe base plate and relatively pressing the first and second wirings.

In any of the embodiments of the present invention, the connecting device includes: a first plate-like body disposed on the first surface; a second plate-like body disposed on the second surface; a plate-like movable body disposed between the first and second plate-like bodies so as to move in the second direction; and a presser for moving the movable body in the second direction relative to the first and second plate-like bodies. Each of the first plate-like body, the second plate-like body and the movable body has a slot portion forming slot in cooperation between the first and second surfaces in cooperation, the slot extending in the third direction intersecting the first and second direction. The first and second wirings extend in the first direction within the slots, and are brought into contact with each other.

In a first embodiment of the present invention, the connecting device further include a first convex member disposed on the first surface, projecting from the first surface into the slot, and extending in the third direction; and a second convex member disposed on the second surface, projecting from the second surface into the slot, and extending in the third direction. The either one of the first and second convex members is received into a combined groove provided on the other of the first and second convex members, the combined groove extending in the third direction and having an inner plane directed to either one of the first and second convex members. Either one of the first and second wirings may extend along at least one of two side surfaces of either one of the first and second convex members, the two side surfaces being directed to the inner surface. The other of the first and second wirings may extend along the inner surface of the combined groove.

In the foregoing first embodiment, either one of the first and second sheet-like members may cover either one of the first and second convex members, and the other of the first and second sheet-like members may cover the side surface of the other of the first and second convex members, and cover the inner surface of the combined groove, the inner surface being directed to either one of the first and second convex members.

In the foregoing first embodiment, the second sheet-like member may have a slit between wirings adjoining in the third direction within the combined groove.

In a second embodiment of the present invention, the connecting device may further includes a convex member disposed on either one of the first and second surfaces, projecting from either one of the first and second surfaces into the slot and extending in the third direction. Either one of the first and second wirings may extend along at least one of two side surfaces of the convex member directed to inner surface of the slot, the inner surface being toward to the second direction. The other of the first and second wirings may extend along at least one of the two inner surfaces of the slot directed to the convex member.

In the foregoing second embodiment, either one of the first and second wirings may further extend along the other of the two side surfaces of the convex member, and the other of the first and second wirings may further extend along the other of the two inner surfaces of the slot.

In the foregoing second embodiment, the other of the first and second sheet-like members can have a member to cover one of the two inner surfaces, and a member to cover the other of the two inner surfaces.

In a third embodiment of the present invention, the connecting device includes a convex member disposed on either one of the first and second surfaces, projecting from either one of the first and second surfaces into the slot, and extending in the third direction. Either one of the movable body, the first plate-like body and the second plate-like body has a convex portion projecting into the slot and extending in the third direction. Either one of the first and second wirings extends along at least one of two side surfaces of the convex member and directed toward the convex portion. The other of the first and second sheet-like members extends along the side surface of the convex portion directed toward the convex member.

In the foregoing third embodiment, the movable body may have a first convex portion projecting into either one of the slot portions of the first and second plate-like bodies and extending in the third direction; either one of the first and second plate-like bodies may include a second convex portion projecting into the slot portion of the movable body through either one of the first and second plate-like bodies and extending the third direction; either one of the first and second wirings may extend along the convex portion; the other of the first and second wirings may extend along the side surfaces of the first and second convex portions.

In the foregoing third embodiment, the other of the first and second sheet-like members may have a member to cover one of the first and second convex portions and a member to cover the other of the first and second convex portions.

In the foregoing third embodiment, the movable body may have a first convex portion projecting into either one of the slot portions of the first and second plate-like bodies and extending in the third direction; either one of the first and second plate-like bodies may have a second convex portion projecting into the slot portion of the movable body through either one of the slot portions of the first and second plate-like bodies and extending in the third direction; either one of the first and second wirings may extend along the side surface of the first convex portion facing the second convex portion; the other of the first and second wirings may extend along the side surface of the second convex portion and facing the first convex portion.

In the foregoing third embodiment, the first or second convex portions may have an elastic member disposed on its side surface.

In a fourth embodiment of the present invention, either one of the movable body, the first plate-like body and the second plate-like body has a convex portion projecting into either one of the slot portions of the first and second plate-like bodies and extending in the third direction, or a convex portion projecting into the slot portion of the movable body through either one of the slot portions of the first and second plate-like bodies and extending in the third direction. Either one of the first and second wirings extends along a side surface of the convex portion directed in the third direction, while the other of the first and second wirings extend along the inner surface of either one of remaining slot portions of the movable body, the first plate-like body and the second plate-like body.

In the foregoing fourth embodiment, either one of the first and second sheet-like members may cover the side surface of the convex portion, the side surface facing in the third direction, while the other of the first and second sheet-like members may cover the inner surface of either one of the remaining slot portions of the movable body, the first plate-like body and the second plate-like body, the inner surface facing the convex portion.

In the fourth embodiment, the convex portion may have an elastic member disposed on its side surface.

In the electrical connecting apparatus of the present invention, coupling of the wiring base plate and probe base plate with each other and release thereof can be carried out by a plurality of screw members. When the first and second sheet-like members are pressed by the pressing device, the first and second wirings are electrically connected, thereby electrically connecting the first and second conductive portions.

Thus, the probe base plate can be standardized by making a common arrangement pattern and a common connection pattern of the second conductive portion of the probe base plate and manufacturing a resin base plate according to types of integrated circuits. Even by doing so, the first and second conductive portions are electrically connected, by making an arrangement pattern

EXPLANATION OF REFERENCE NUMERALS

Figure 1:
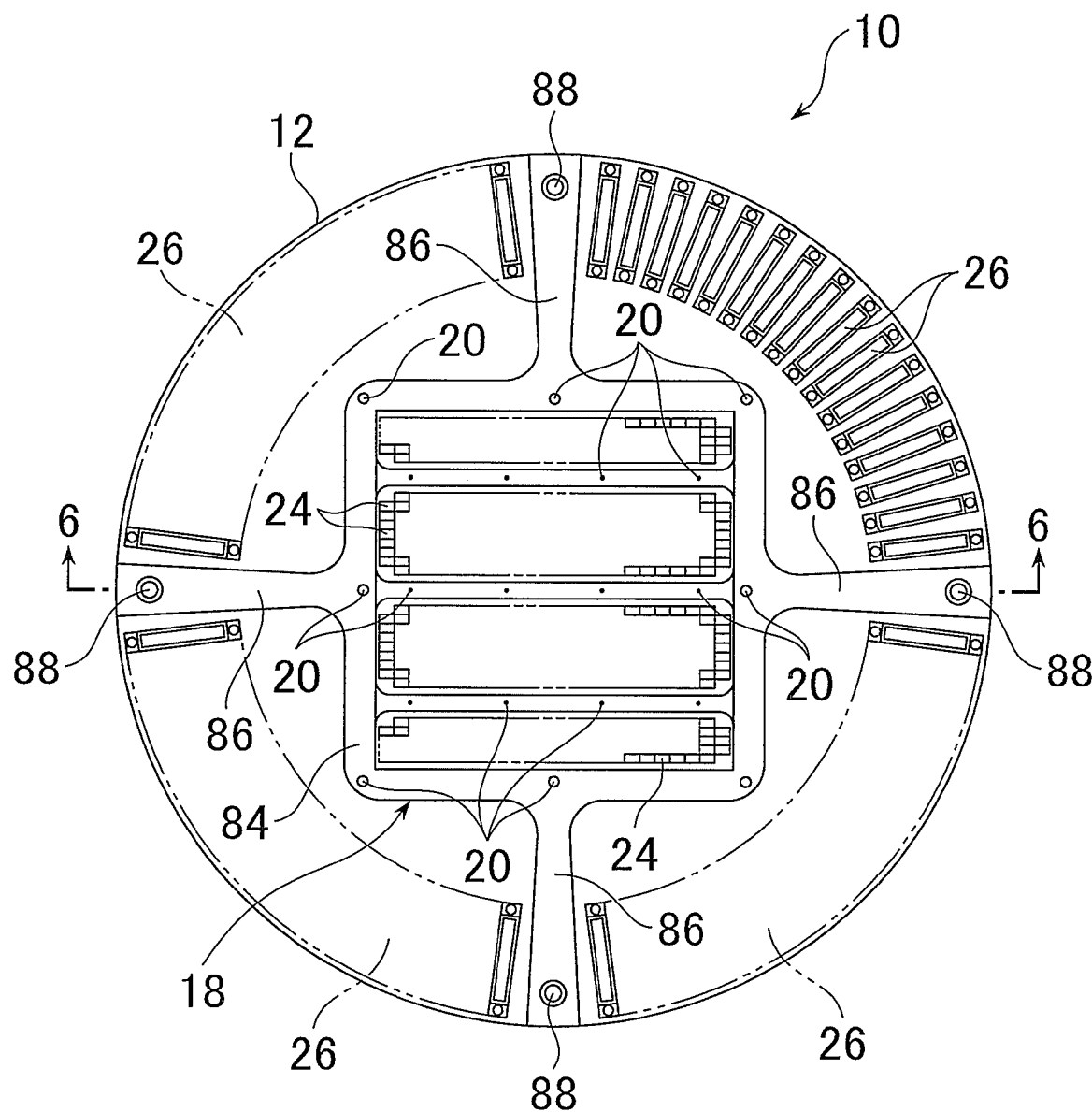
FIG. 1 is a plan view showing one embodiment of the electrical connecting apparatus according to the present invention.
Figure 2:
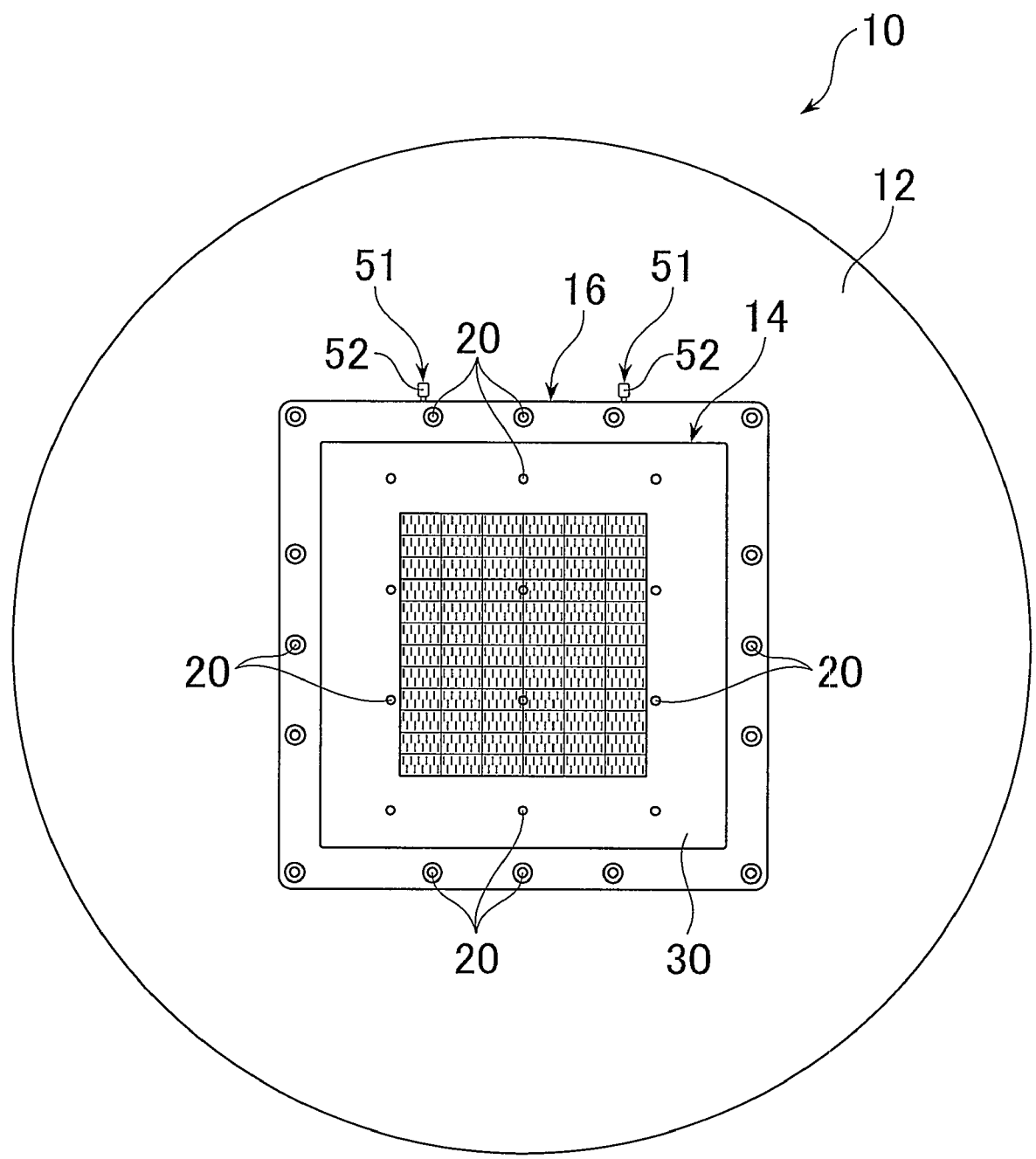
FIG. 2 is a bottom view of the electrical connecting apparatus shown in FIG. 1.
Figure 3:
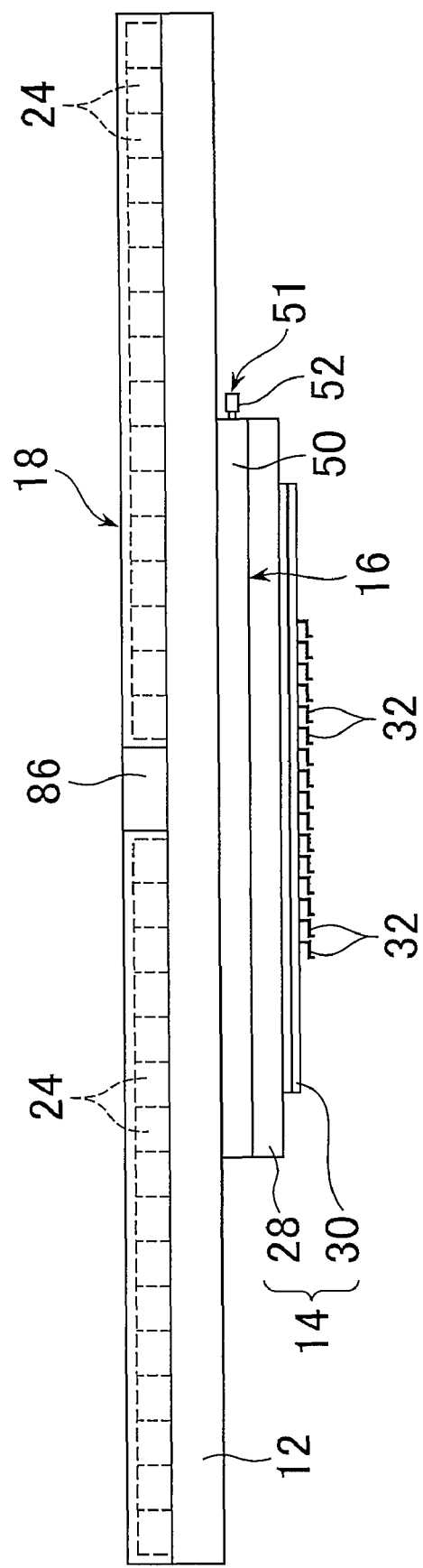
FIG. 3 is a front elevation of the electrical connecting apparatus shown in FIG. 1.
Figure 4:
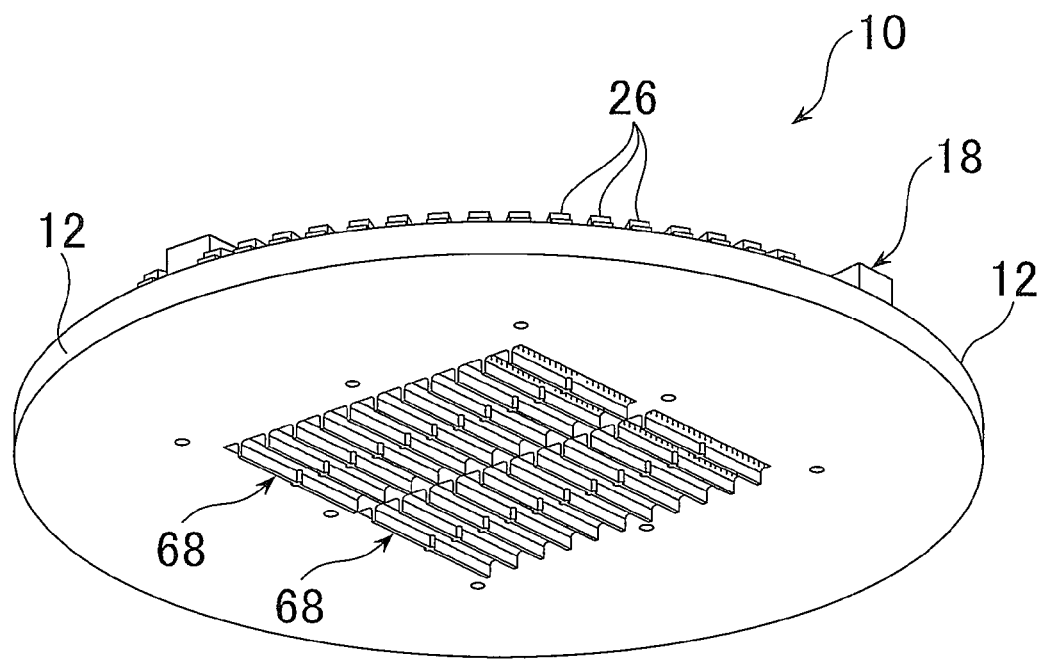
FIG. 4 is a perspective view seeing the electrical connecting apparatus shown in FIG. 1 from below with a part exploded.
Figure 4:
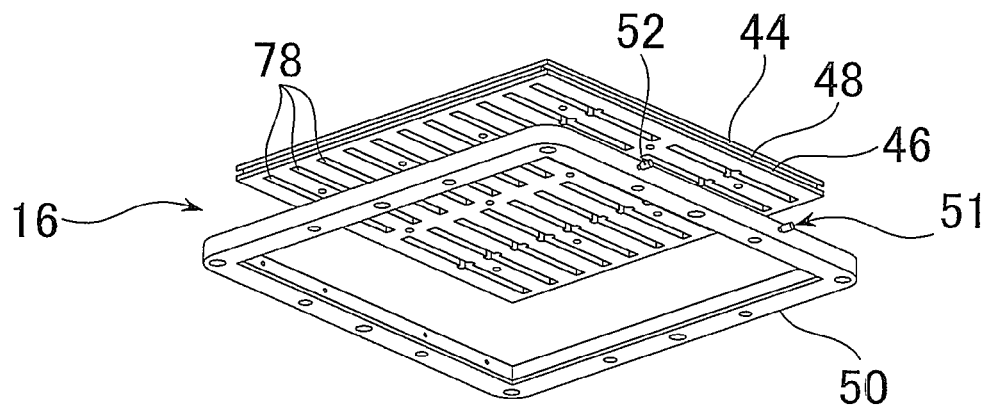
Figure 4:
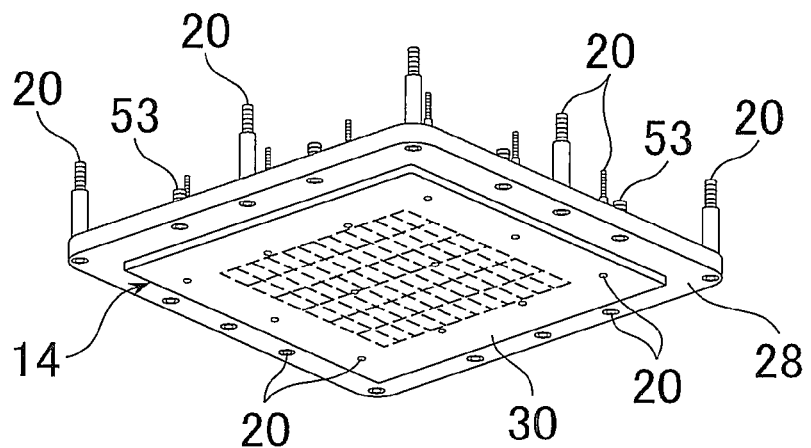

10 electrical connecting apparatus
12 wiring base plate
14 probe base plate
16 connecting device
18 reinforcing member
20 screw member
22, 36, 38 conductive portion
24 electronic components
26 connector
28 ceramic base plate
30 resin base plate 32 contact
40 cylindrical member
44, 46 plate-like body
48 movable body
50 frame
51 presser
52 pressing screw
53, 88 screw member
54 pressing pin
56 compression coil spring
58 lockscrew
60 screw hole
62 hole
64, 66 convex member
68, 70 sheet-like member
72, 76 wiring
74 combined groove
78 slot
80 positioning member
82 concave portion
84 frame portion
86 arm portion
90 spacer
92, 94 convex portion

DETAILED DESCRIPTION

In the following explanation, the thickness direction of each base plate is defined as upward and downward direction or Z-direction, the tip side of the contact relative to each base plate (semiconductor wafer side) is defined as the underside, and two directions in a horizontal rectangular coordinate parallel to each base plate are defined as X-direction and Y-direction. However, in case of actual use of the electrical connecting apparatus, the thickness direction of each base plate may be used as a diagonal or lateral direction, and the upward and downward direction may be used upside down.

First Embodiment

Referring to FIGS. 1-11, the electrical connecting apparatus 10 uses as a device under test an integrated circuit including a plurality of electrodes for electric source, earth and signals such as a non-cut integrated circuit formed on a semiconductor wafer or an integrated circuit cut into chips.

As shown in FIGS. 1-5, the electrical connecting apparatus 10 comprises: a wiring base plate 12 attached to an inspection apparatus; a probe base plate 14 disposed on the underside of the wiring base plate 12, the probe base plate 14 having a plurality of contacts 32 as explained later; a connecting device 16 placed between the wiring base plate 12 and the probe base plate 14 to electrically connect conductive portions 22 and 36 of the wiring base plate 12 and the probe base plate 14 as explained later; a reinforcing member 18 disposed on the upside of the wiring base plate 12; and a plurality of screw members 20 for coupling the wiring base plate 12 and the probe base plate 14 into the reinforcing plate 18, interposing the connecting device 16 therebetween.

The wiring base plate 12 is formed as a circular multilayered base plate having a plurality of conductive portions 22 (see FIGS. 8 and 11) on the lower surface and a plurality of wirings (not shown) electrically connected to those conductive portions 22 in the multiple layers.

The conductive portions 22 are divided into a plurality of main groups respectively including a plurality of conductive portions 22 at intervals in the horizontal X-direction. Those main groups are spaced apart in the horizontal Y-direction intersecting the X-direction.

In the illustration, the conductive portions 22 of each main group are further divided into two subgroups spaced apart in the Y-direction. The conductive portions 22 of each subgroup are spaced apart in the X-direction. The conductive portions 22 of each main group are not necessarily divided into such subgroups.

The electrodes of the integrated circuit and the conductive portions 22 are made to correspond in one-to-one relationship. Such a wiring base plate 12 can be made of a glass-containing epoxy resin.

In the middle of the upper surface of the wiring base plate 12, a plurality of electronic components 24 (see FIG. 1) such as a relay, a resistor or the like are arranged in substantially rectangular regions as viewed in a surface. Respective electronic components 24 are made to correspond to electrodes for the source or signal, adhered to connection lands (not shown) by an electrically conductive adhesive such as solder and electrically connected to the wirings formed on the wiring base plate 12.

On the upper surface of the wiring base plate 12 are also arranged a plurality of connectors 26 (see FIG. 1) to be connected to the electric circuit of the inspection apparatus. Each connector 26 is electrically connected to the conductive portion 22 through the wirings of the wiring base plate 12 and the electronic components 24.

The probe base plate 14 has a substantially rectangular ceramic base plate 28, a rectangular resin base plate 30 formed on the lower surface of the ceramic base plate 28, and a plurality of contacts 32 individually corresponding to the electrodes of the integrated circuit attached to the lower surface of the resin base plate 30.

Figure 8:
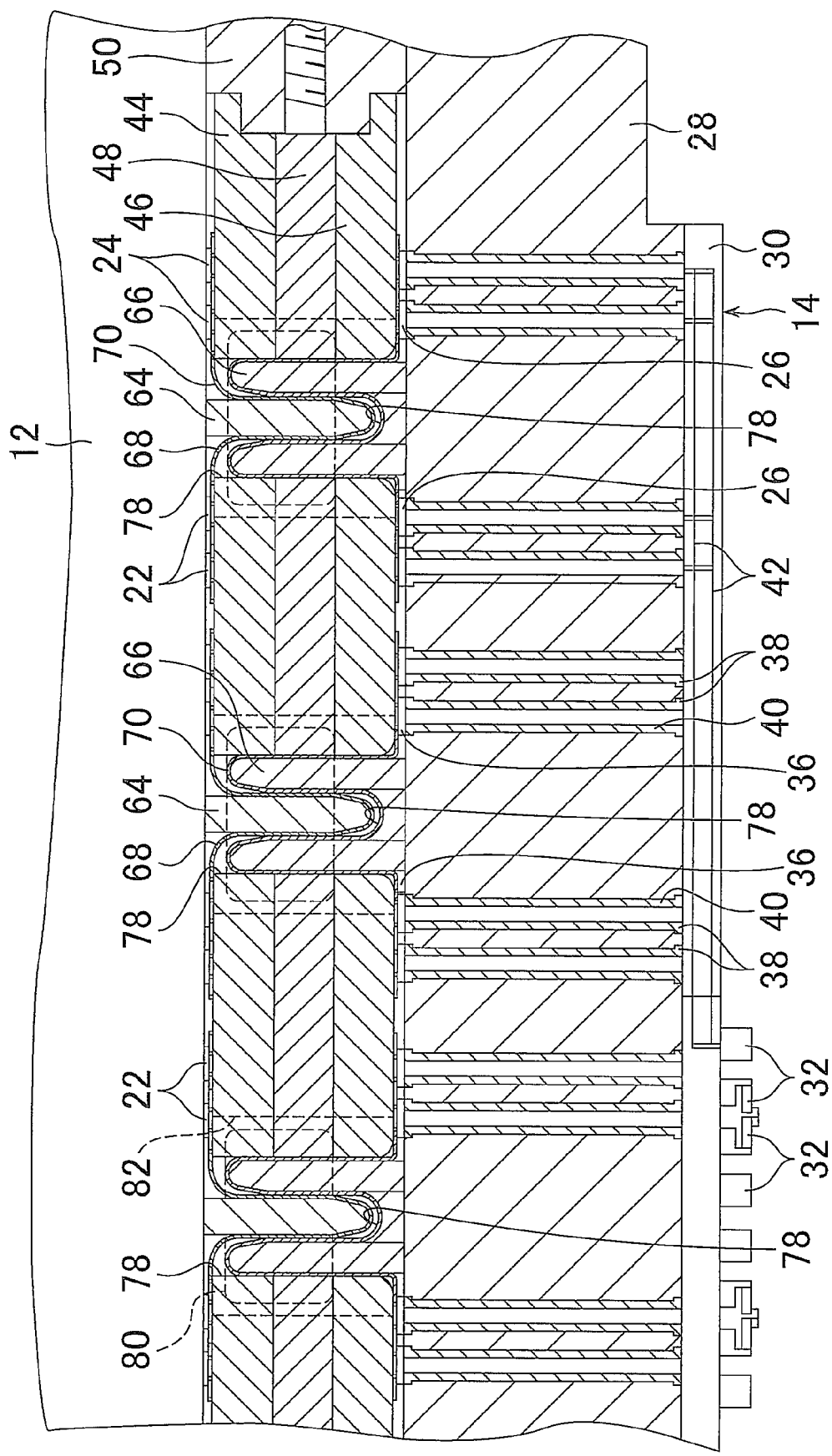
FIG. 8 is an enlarged section to explain the connecting device.
Figure 11:
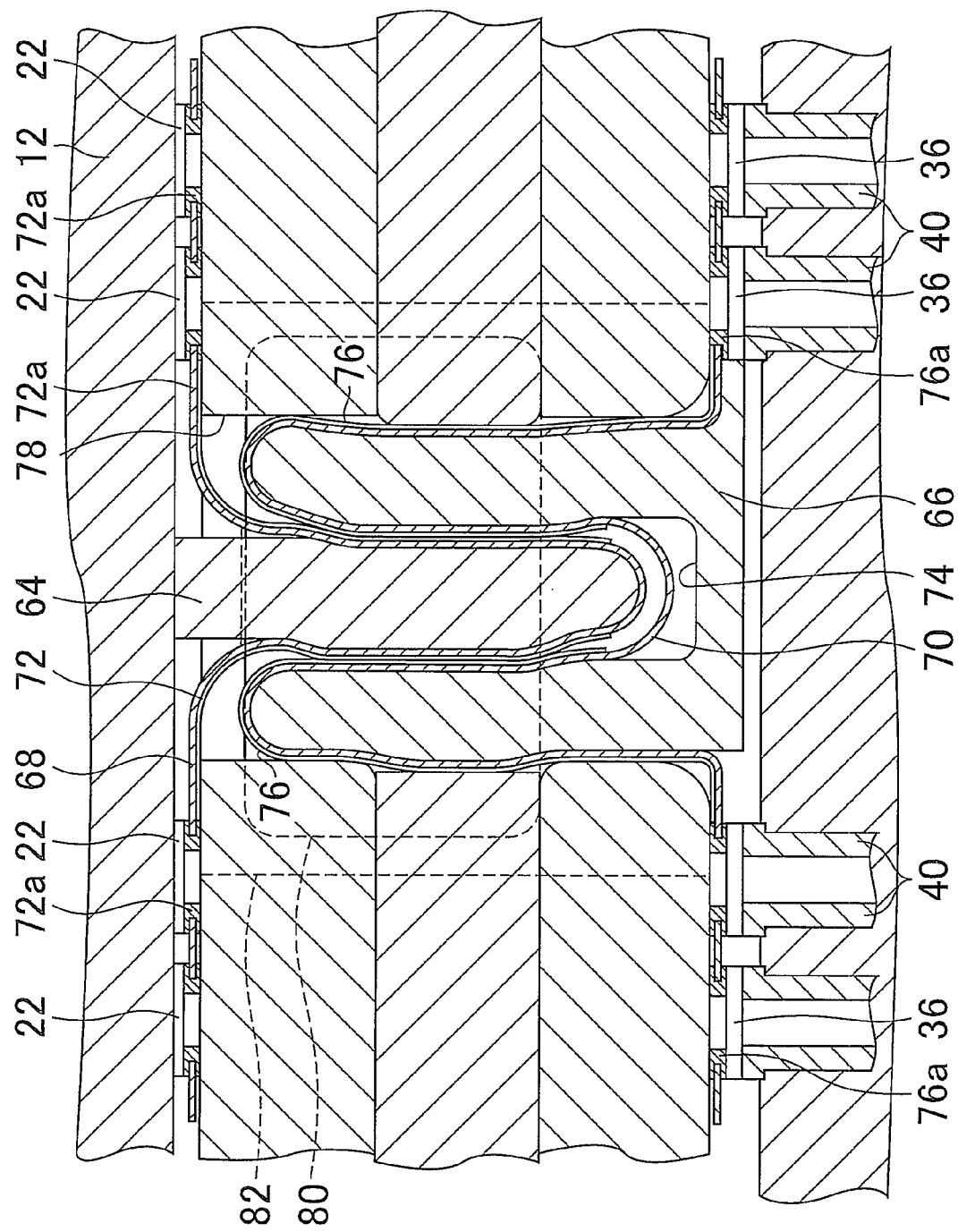
FIG. 11 is a longitudinal section showing a state where the movable body is displaced relative to the first and second plate-like body.

The ceramic base plate 28 is, as shown in FIGS. 8 and 11, provided with a plurality of conductive portions 36 and 38 formed respectively on both upper and lower surfaces such that the conductive portions 36 and 38 are electrically connected in one-to-one relationship by conductive cylindrical members 40. The conductive portions 38 are formed at the lower ends of the cylindrical members 40. The conductive portions 36 may be formed at the upper ends of the cylindrical members 40.

The cylindrical member 40 penetrates the ceramic base plate 28 in the thickness direction. The ceramic base plate 28 may be provided with a reinforcing member.

In place of the foregoing, it is possible to divide the cylindrical member 40 into two members, i.e., upper and lower members, and the upper member of a certain cylindrical member may be electrically connected to the lower member of another cylindrical member 40 by wirings not shown. In such a case, those wirings act as reinforcing members.

The conductive portions 36 correspond to the conductive portions 22. Thus, the conductive portions 36, like the conductive portions 22, are divided into a plurality of main groups respectively including a plurality of conductive portions 36 spaced apart from each other in the X-direction. The conductive portions 36 of each main group are divided into a plurality of subgroup groups. The conductive portions 36 of each subgroup are individually made to correspond to the conductive portions 22 of the subgroup.

The conductive portions 38 may be divided into groups like the conductive portions 36 or otherwise. The conductive portions 38 can, therefore, be arranged in a proper alignment pattern, that is, arrangement pattern.

The resin base plate 30 is directly formed on the lower surface of the ceramic base plate 28, using an electrically insulating resin such as polyimide. The resin base plate 30 is provided on both its upper and under surfaces with a plurality of conductive portions (not shown) acting as connection pads, and these upper and lower conductive portions are electrically connected in one-to-one correspondence by the wirings 42 (see FIG. 8).

The conductive portions provided on the upside of the resin base plate 30 are made to correspond to the conductive portions 22, 36 and 38, but those provided on the underside of the resin base plate 30 are arranged in correspondence to the arrangement pattern of the electrodes of the integrated circuit.

Each contact 32 is adapted to be a plate-like contact (probe). Each contact includes a attached portion to the conductive portion of the lower surface of resin base plate 30, a arm portion extending from the attached portion in the Y-direction, and a tip portion extending from the front end side of the arm portion in the opposite direction (downward) to the mounting portion.

Such a contact 32 is publicly known as a micro cantilever type contact (probe). The contact 32, however, may be another type of probe such as a needle-type contact made of a thin metallic wire, instead of such a micro cantilever type contact.

Each contact 32 is adhered by using a conductive adhesive such as solder and cantilevered at the mounting portion to the conductive portion provided on the underside of the resin base plate 30 so as to extend downward from the resin base plate 30.

Figure 7:
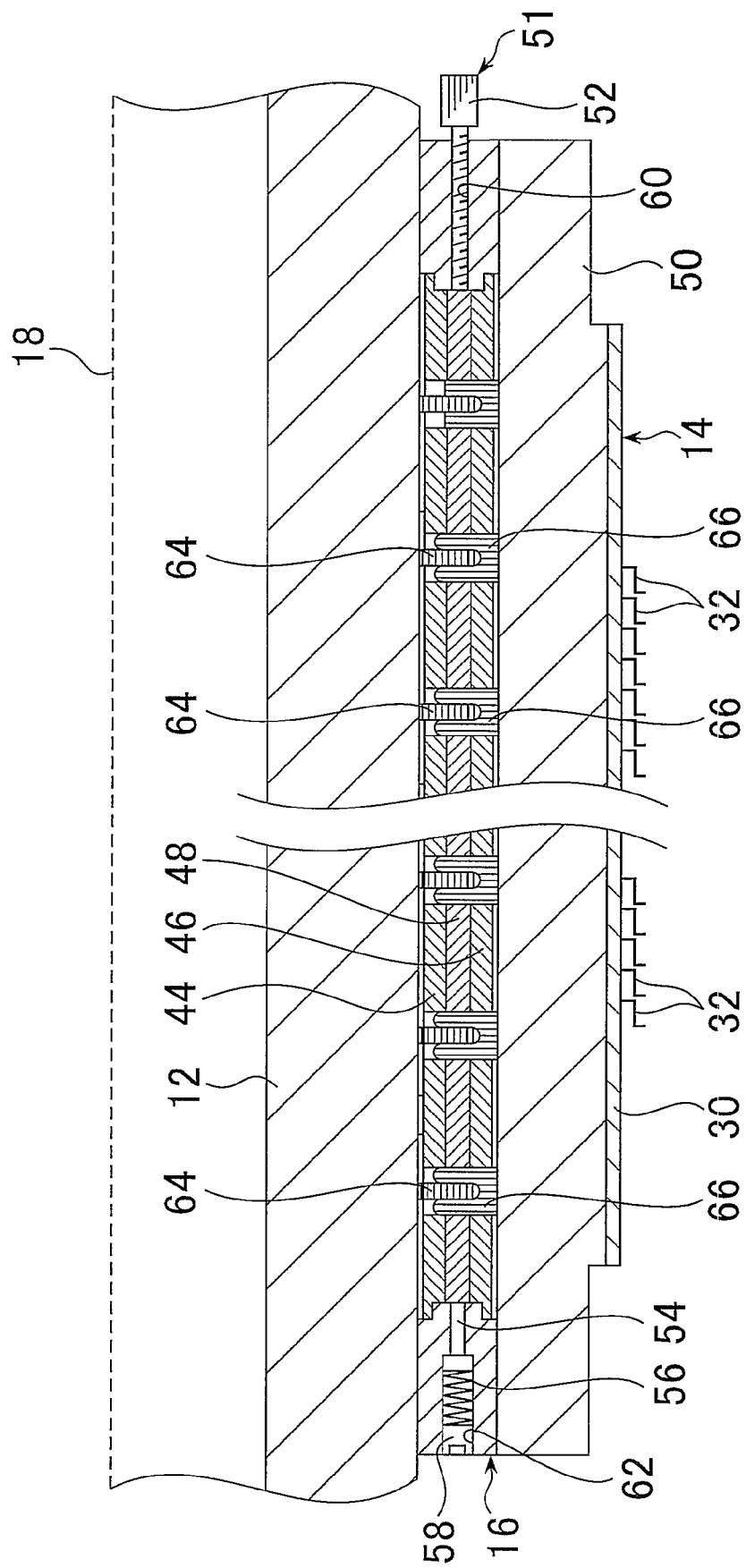
FIG. 7 is a longitudinal section to explain the presser used for the electrical connecting apparatus shown in FIG. 1.

The connecting device 16 includes: a first plate-like body 44 disposed on the lower surface of the wiring base plate 12; a second plate-like body 46 disposed on the upper surface of the ceramic base plate 28 at a distance downward from the first plate-like body 44; a plate-like movable body 48 disposed between the first and second movable bodies 44 and 46 so as to move at least in the Y-direction; a rectangular frame 50 enclosing the first and second plate-like bodies 44 and 46 so as not to move; and a pair of pressers 51 pressing the movable body 48 in the Y-direction relative to the plate-like bodies 44 and 46 (see FIG. 7).

Figure 6:
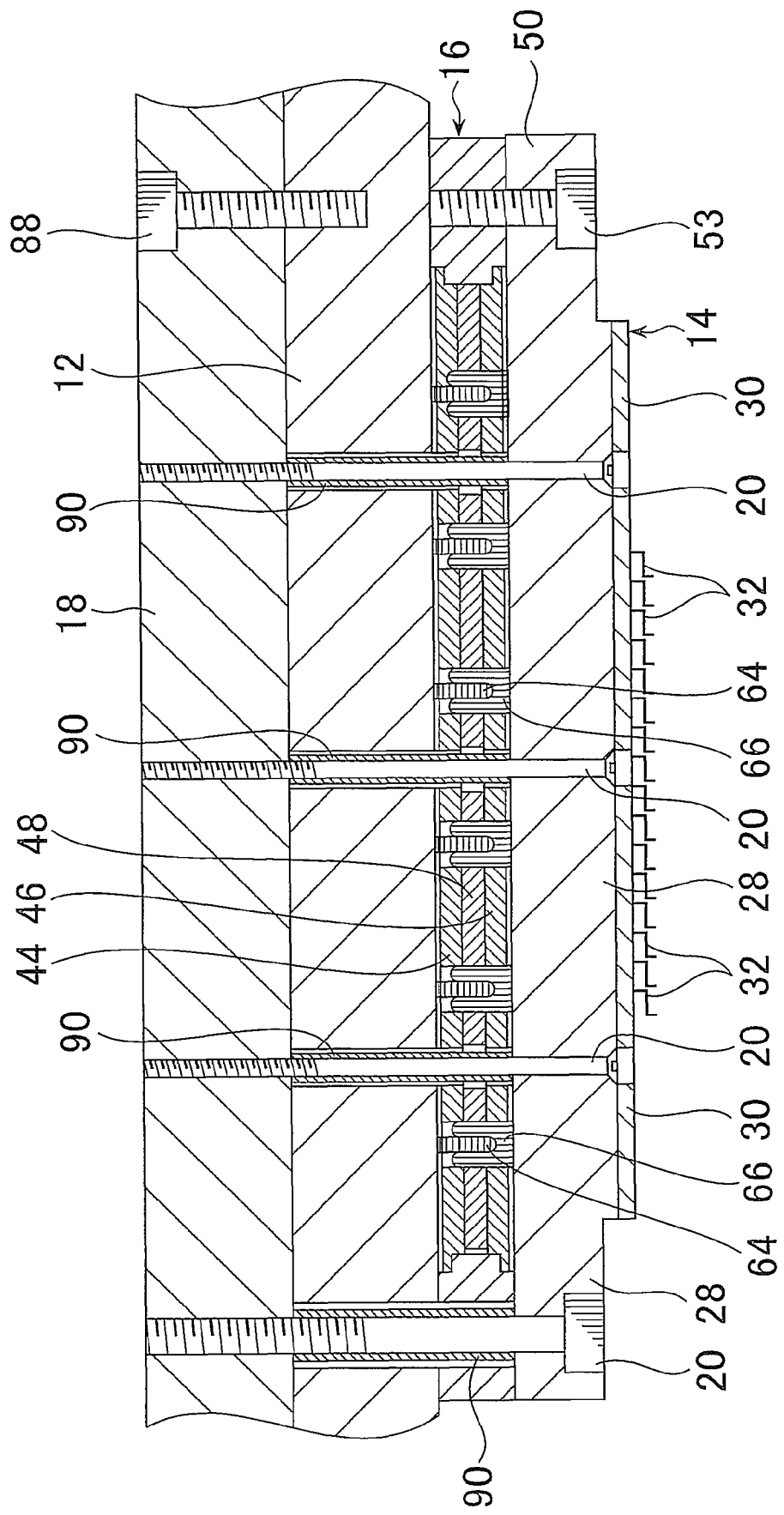
FIG. 6 is a sectional view obtained along the line 6-6 in FIG. 1 omitting a part.

As shown in FIG. 6, the first and second plate-like bodies 44 and 46 are disposed on the frame 50 with the movable body 48 sandwiched movably therebetween. The connecting device 16 is coupled with the probe base plate 14 with a plurality of screw members 53 screwed into the frame 50, penetrating the ceramic base plate 28 from below.

Each presser 51 includes: a pressing screw 52 pressing the movable body 48 in the Y-direction relative to the first and second plate-like bodies 44 and 46; a pressing pin 54 energizing the movable body 48 in the opposite direction to the pressing direction by the pressing screw 52; a compression coil spring 56 energizing the pressing pin 54; and a lockscrew 58 stopping the compression coil spring 56 (see FIG. 7).

The pressing screw 52 is screwed into a screw hole 60 formed in a member on one side in the Y-direction of the frame 50 from the outside of the frame 50 and penetrates into the inside of the frame 50.

The pressing pin 54, the compression coil spring 56 and the lockscrew 58 are disposed in this order in a hole 62 formed in a member on the other side in the Y-direction of the frame 50. One end portion in the Y-direction of the hole 62 is a narrow hole through which a part of the pressing pin 54 penetrates. The other end in the Y-direction of the hole 62 is a screw hole into which the lockscrew 58 is screwed.

The connecting device 16 also includes: a plurality of first convex members 64 disposed on the underside of the wiring base plate 12 so as to extend in the X-direction at intervals in the Y-direction; a plurality of second convex members 66 disposed on the upside of the ceramic base plate 28 so as to extend in the X-direction at intervals in the Y-direction; a plurality of first sheet-like members 68 disposed on the wiring base plate 12 at each first convex member 64 so as to cover the first convex members 64 and the conductive portions 22; and a plurality of second sheet-like members 70 disposed on the ceramic base plate 28 at each second convex member 66 so as to cover the exposed surfaces of the second convex members 66 and the conductive portions 36 (see FIGS. 7-11).

In the illustration, the first and second plate-like bodies 44 and 46, movable body 48, frame 50, presser 51 and first and second convex members 64 and 66 act as a part of the pressing device.

Each first convex member 64 has a convex shape projecting from the lower surface of the wiring base plate 12 to extend in the X-direction. Each first convex member 64 is made of an elastically deformable hard rubber to be an arc-like top surface (lower surface) in a vertical surface orthogonal to the X-direction.

Each first convex member 64 is attached to the lower surface of the wiring base plate 12 with an adhesive, vises or the like so as to extend in the X-direction between groups adjoining in the Y-direction of the conductive portions 22.

Each first sheet-like member 68 is an FPC having a plurality of wirings 72 extending in the Y-direction on the surface on the side of the ceramic base plate 28, and are adhered to the wiring base plate 12 and the first convex member 64.

The wirings 72 of each first sheet-like member 68 are, as in case of the conductive portions 22, divided into the main groups spaced apart in the Y-direction. The wirings 72 of each main group are divided into a plurality of subgroups. The wirings 72 each of each subgroup are spaced apart in the X-direction.

Figure 9:
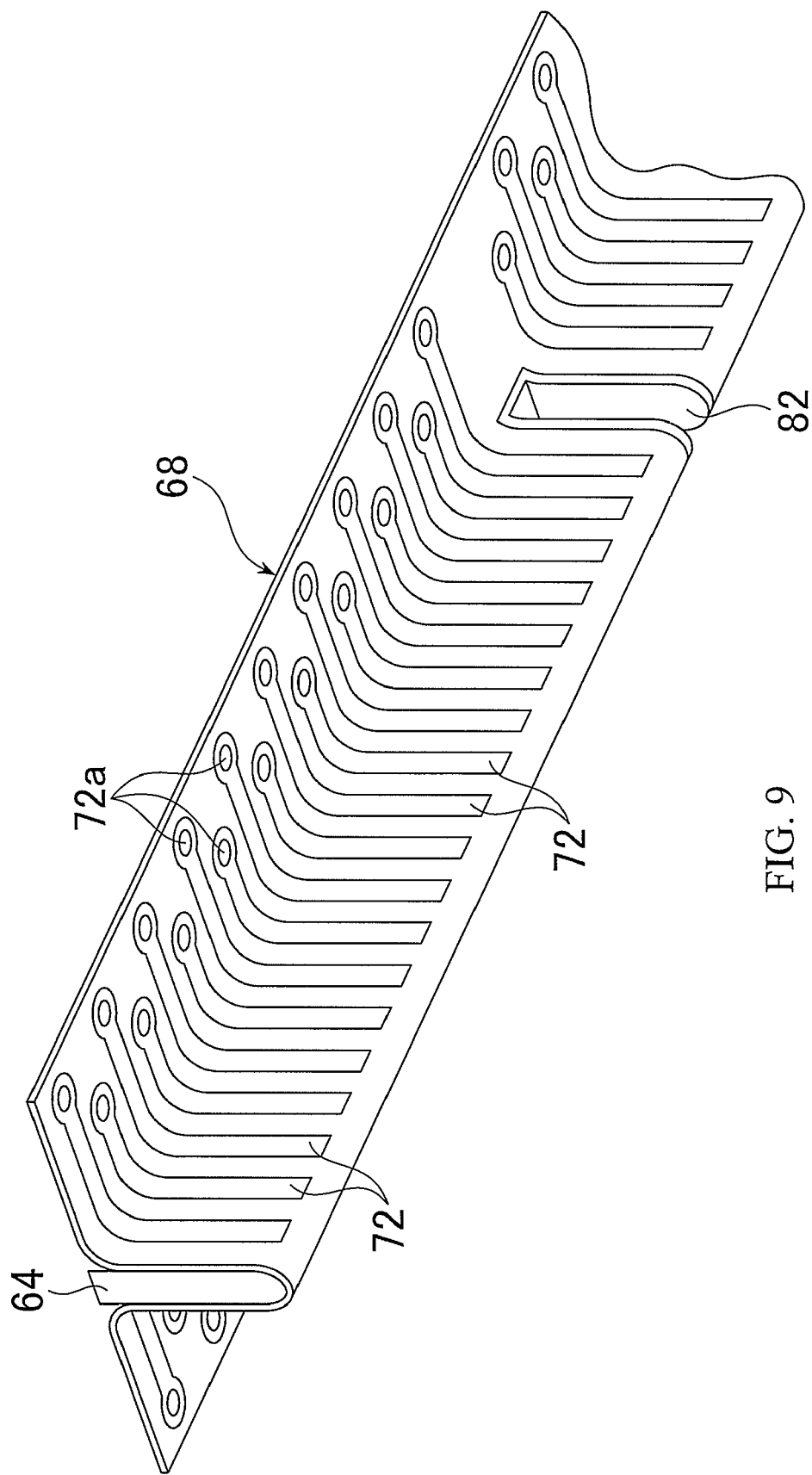
FIG. 9 is a perspective view showing a part of one embodiment of the first convex member and first sheet-like member.

Each wiring 72 has at one end, as shown in FIG. 9, an electrode 72a brought into contact with the conductive portion 22 and extends from the corresponding conductive portion 22 to the vicinity of the top portion of the first convex member 64.

Each second convex member 66 opens upward so as to receive the first convex member 64, has an inverted U-shaped combined groove 74 extending in the X-direction, and is attached to the upper surface of the ceramic base plate 28 with an adhesive, vises or the like such that the combined groove 74 extends in the X-direction between adjoining groups of the conductive portions 36. Each second convex member 66 is made of an elastically deformable hard rubber material.

Each second sheet-like member 70 is an FPC having a plurality of wirings 76 on the side of the wiring base plate 12 and are adhered to the ceramic base plate 28 and the second convex member 66 so as to cover over a range of the upper surface of the ceramic base plate 28, the second convex member 66 and the inner surface of the combined groove 74. Each wiring 76 is electrically connected to the corresponding conductive portion 36.

The wirings 76 of each second sheet-like member 70, as in case of the conductive portions 22, are divided into main groups spaced apart in the Y-direction and are divided into a plurality of subgroups at each main group.

Figure 10:
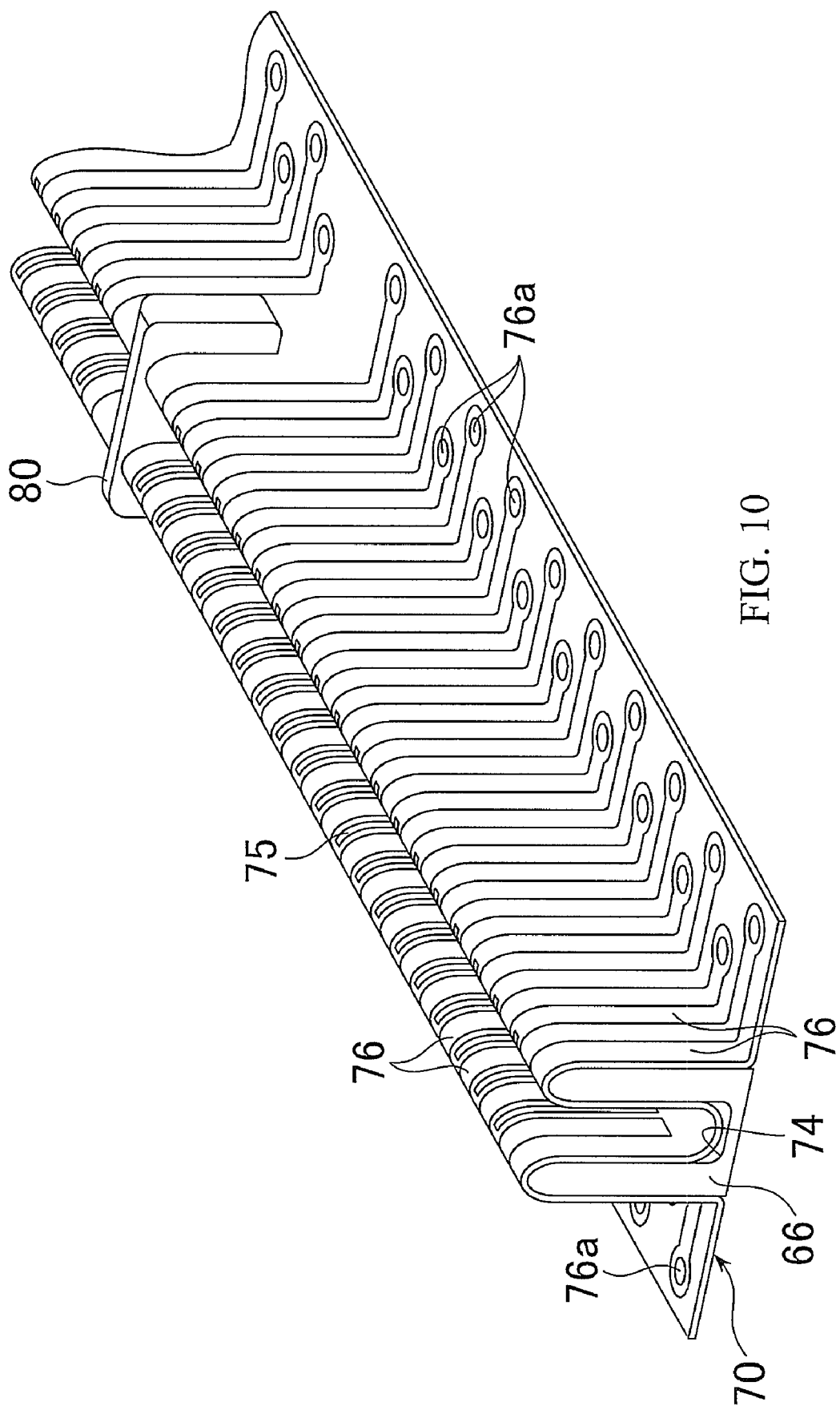
FIG. 10 is a perspective view showing a part of one embodiment of the second convex member and second sheet-like member.

As shown in FIG. 10, each wiring 76 has at one end portion an electrode 76a brought in contact with the conductive portion 36 and extends from the corresponding conductive portion 36 to the vicinity of the bottom of the combined groove 74.

The width dimension of the combined groove 74 is, in the illustration, approximately the same as or a little larger than the thickness dimension of the first convex member 64, but may be adapted to facilitate attaching and removing of the first convex member 64. Each second sheet-like member 70 has a slit 75 formed within the combined groove 74 between the wirings 76 adjoining in the X-direction.

The first and second plate-like bodies 44, 46 and the movable body 48 form in cooperation with slots a plurality of slots 78 extending in the X-direction at intervals in the Y-direction. Each slot 78 has a size that can receive the second convex member 66.

The first and second convex members 64 and 66 are inserted into the slots 78 in a state of being covered with the first and second sheet-like members 68 and 70.

The first convex members 64 are fitted into the combined groove 74 within the slots 78. Thus, the wirings 72 and 76 extends in the up and down direction in an opposed state within the slots 78 and are electrically connected in contact with each other.

As shown in FIGS. 8 and 10, a plurality of positioning members 80 are immovably attached to each second convex member 66 at intervals in the X-direction.

As shown in FIGS. 8 and 9, a plurality of concave portions 82 are formed in each first convex member 64 at intervals in the X-direction so as to receive positioning members 80.

Each of the first and second sheet-like members 68 and 70, the first and second plate-like bodies 44 and 46 and the movable body 48 is eliminated portions corresponding to the concave portions 82 so as to receive the positioning members 80.

As shown in FIG. 1, the reinforcing member 18 has a substantially rectangular frame portion 84 located around the electronic components 24, and a plurality of arm portions 86 extending from the frame portion 84 in a radial direction of an imaginary circle. Thereby, the upper region of the wiring base plate 12 can be effectively used.

The wiring base plate 12 and the frame 50 respectively have uniform thickness dimensions. Both of the upside and underside of the frame 50 are polished to be surfaces at the same height level. Both the lower surface of the reinforcing plate 18 and the upper surface of the ceramic base plate 28 are polished likewise to be surfaces at the same height level.

The undersides of the conductive portions 22, the upsides of the conductive portions 36 and electrodes 72*a*, 76*a* are likewise polished to be surfaces at the same height level respectively.

Figure 5:
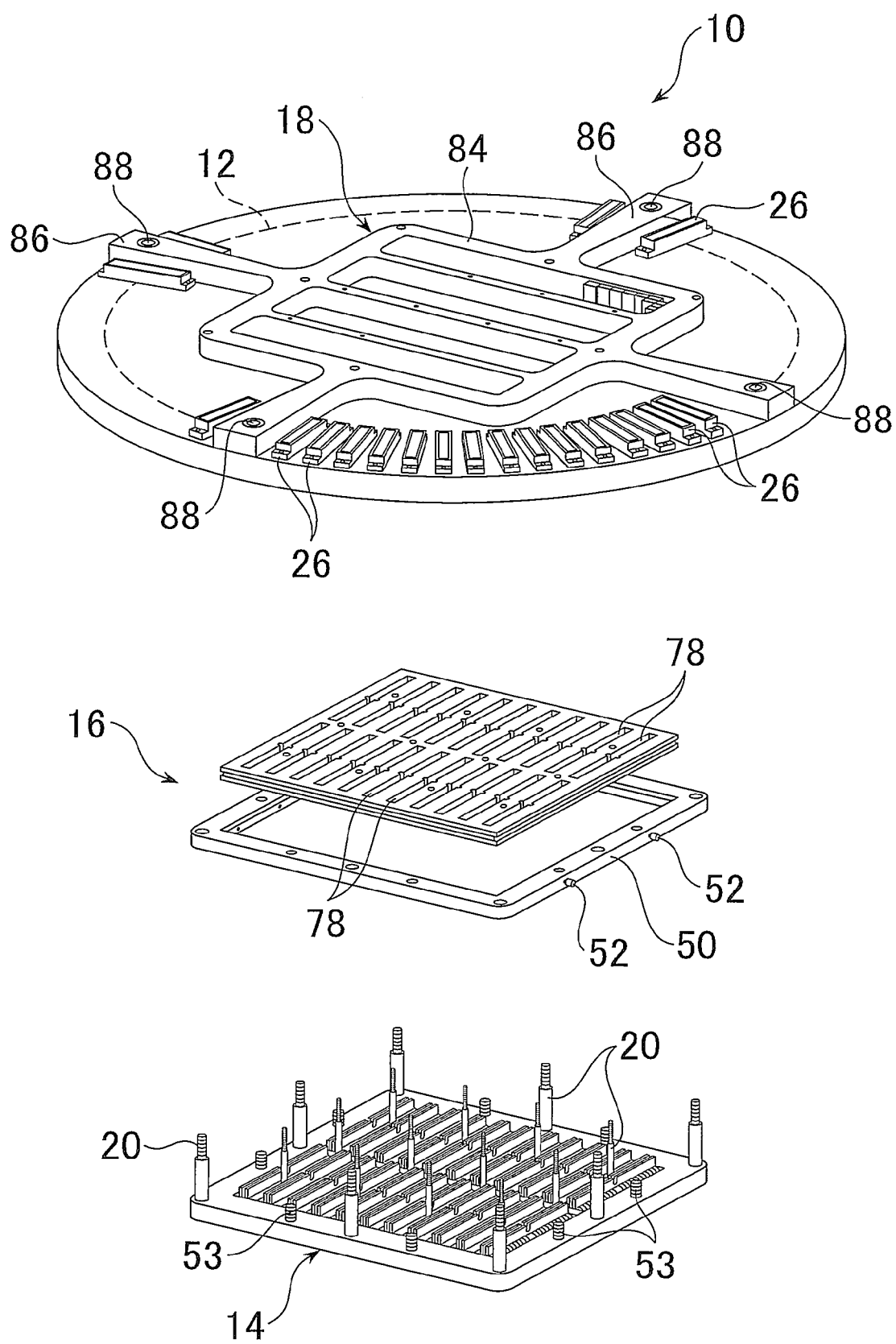
FIG. 5 is a perspective view seeing the electrical connecting apparatus shown in FIG. 1 from above with a part exploded.

As shown in FIGS. 1, 5 and 6, the wiring base plate 12 and the reinforcing plate 18 are coupled by a plurality of screws 88 penetrating the reinforcing plate 18 and screwed into the wiring base plate 12. Thus, the wiring base plate 12 is reinforced.

Each screw member 20 penetrates the probe base plate 14, connecting device 16 and wiring base plate 12, and is screwed into the reinforcing plate 18.

The distance between the probe base plate 14 and the reinforcing plate 18 is maintained constant by a cylindrical spacer 90 which is around each screw member 20 to penetrate the connecting device 16 and the wiring base plate 12. Therefore, by screwing all the screw members 20 into the reinforcing plate 18 such that the upper end and the lower end of each spacer 90 respectively contact the lower surface of the reinforcing plate 18 and the upper surface of the ceramic base plate 28, the wiring base plate 12, probe base plate 14, connecting device 16 and reinforcing plate 18 are firmly coupled, and the lower ends of the contacts 32 are maintained at the same height position.

When assembled as mentioned above, the first convex member 64 is inserted into the combined groove 74 of the second convex member 66 covered by the second sheet-like member 70 in a state of being covered with the first sheet-like member 68. The first and second wirings 72 and 76 are opposed within the combined groove 74.

In a state of being assembled as mentioned above, the movable plate 48 is moved leftward in FIG. 7 by screwing the pressing screw 52 into the frame 50. Thus, as shown in FIG. 11, the first and second convex members 64 and 66 are elastically deformed to bring the first and second wirings 72 and 76 surely into contact.

When replacing the probe base plate 14, the screw member 20 is removed first in a state that the movable plate 48 is moved rightward in FIG. 7 by the presser 51. By this, the probe base plate 14 and connecting device 16 are removed from the wiring base plate 12 and reinforcing plate 18.

Next, the screw member 53 is removed from the connecting device 16. By this, the probe base plate 14 is removed from the connecting device 16 along with the second convex member 66 and second sheet-like member 70.

Then, a new probe base plate 14 having new second convex members 66 and the second sheet-like members 70 are attached to the connecting device 16, and the probe base plate 14 and connecting device 16 are attached to the wiring base plate 12 and reinforcing plate 18 by the screw members 20 as mentioned above.

Relative positioning of the wiring base plate 12, probe base plate 14 and connecting device 16 can be carried out by a plurality of positioning pins (not shown) extended through the frame 50 from the wiring base plate 12 and inserted into the ceramic base plate 28.

At the inspection, the lower ends (tips) of the contacts 32 of the electrical connecting apparatus 10 are pressed against the electrodes of the integrated circuit. At this time, since the height levels of the lower ends of the contacts 32 are the same, all the contacts 32 are surely brought into contact with the electrodes of the integrated circuit.

According to the electrical connecting apparatus 10, coupling with and releasing from each other of the wiring base plate 12 and probe base plate 14 can be carried out by the plural screw members 20. Also, when the sheet-like members 68 and 70 are pressed by the presser 51, the wirings 72 and 76 are electrically connected, resulting in electrical connection of the conductive portions 22 and 36.

Thus, the probe base plate 14 can be standardized by making the arrangement pattern and connection pattern of the conductive portions 36 of the probe base plate 14 common and producing the resin base plate according to the type of the integrated circuit. Even by doing so, the conductive portions 22 and 36 are electrically connected.

The standardized ceramic base plate 28 can be low-priced by mass production, and a production period of the electrical connecting apparatus 10 can be shortened.

If the ceramic base plate 28 and resin base plate 30 are used as the probe base plate 14, the number of wirings formed on the ceramic base plate 28 can be reduced, and even there may be cases where the wirings are not required on the ceramic base plate 28, thereby to facilitate the manufacture of the ceramic base plate 28 and make the ceramic base plate 28 cheap.

In the foregoing first embodiment, the first and second sheet-like members 68 and 70 may be respectively divided into two members in the vicinity of the boundary of the two main groups of the wirings 72 and 76 (the vicinity of the lower end and upper end of the first convex member 64, respectively). In such a case, the member having the wirings 72 and 76 of one main group may be omitted.

Second Embodiment

Figure 12:
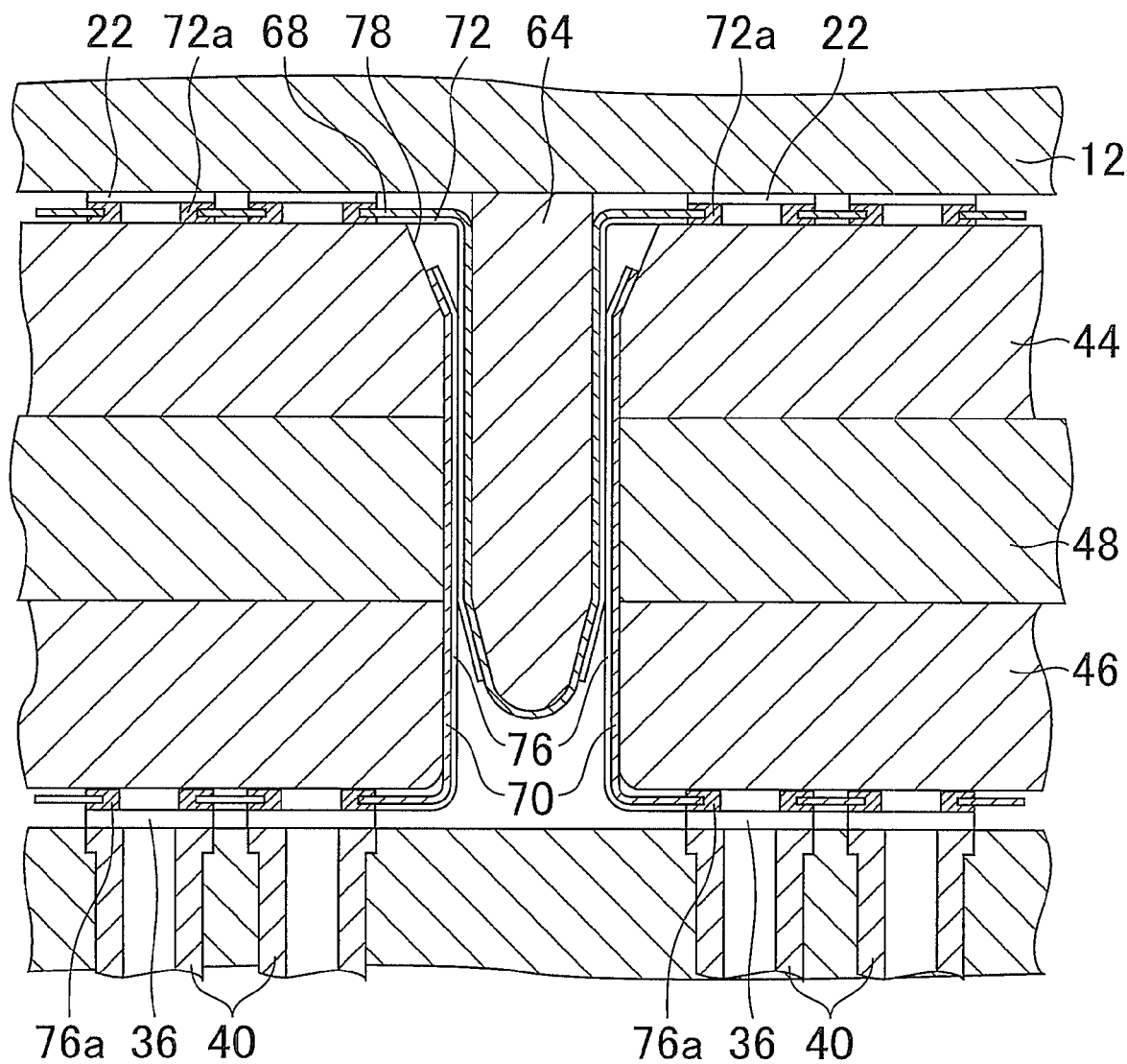
FIG. 12 is a sectional view similar to FIG. 11, showing the second embodiment of the electrical connecting apparatus according to the present invention.

Referring to FIG. 12, the second convex member 66 is omitted in the connecting device 16. The convex member 64 projects from the underside of the wiring base plate 12 into the slot 78 and extends in the X-direction.

In the second embodiment shown in FIG. 12, the second sheet-like member 70 is divided into two members in the vicinity of the boundary of the two main groups of the wirings 76 (the vicinity of the upper end of the first convex member 64).

The wiring 72 extends along the side surfaces of the convex member 64 which are the side surfaces directed in the Y-direction of the slot 78. The wiring 76 extends along the two inner surfaces of the slot 78 which are the inner surfaces directed to the convex member 64.

The width dimension of the slot 78 is sufficient if it can accommodate the convex member 64 in a state that both side surfaces of the convex member 64 and both inner surfaces of the slot 78 are respectively covered with the first and second sheet-like members 68 and 70.

In the second embodiment, when the movable body 48 is moved leftward in FIG. 12 relative to the first and second plate-like bodies 44 and 46, the convex member 64 is elastically deformed to press the wiring 76 against the wiring 72.

In the foregoing second embodiment, it is possible, contrariwise, to place the first convex member 64 on the upside of the ceramic base plate 28, to cover the inner surfaces of the slot 78 with the first sheet-like member 68, and to cover the first convex member 64 with the second sheet-like member 70.

Also, in the second embodiment, it is possible to divide the first sheet-like member 68 into two members in the vicinity of the boundary of the two main groups of the wiring 72 (the vicinity of the lower end of the first convex member 64).

In any case, in the second embodiment, it is possible to omit the member having the wirings 72 and 76 of the one main group.

Third Embodiment

Figure 13:
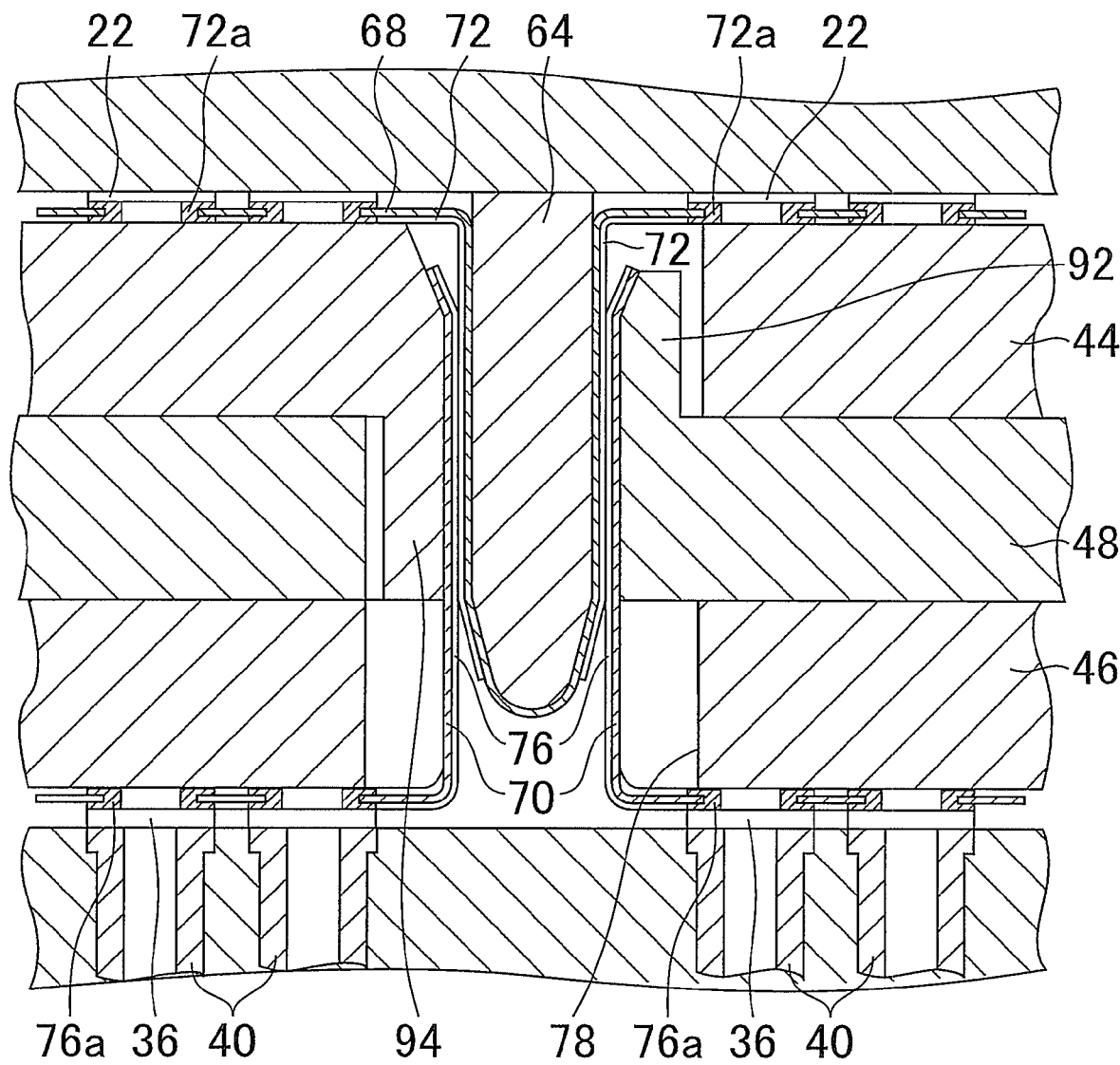
FIG. 13 is a sectional view similar to FIG. 11, showing the third embodiment of the electrical connecting apparatus according to the present invention.

Referring to FIG. 13, the connecting device 16, in place of the second convex member 66, is provided with convex members 92 and 94 projecting into the slot 78 and extending in the X-direction respectively in the movable body 48 and the first plate-like body 44.

In the third embodiment shown in FIG. 13, the second sheet-like member 70 is divided into two members in the vicinity of the boundary of the two main groups of the wiring 76 (the vicinity of the upper end of the first convex member 64).

The inward surfaces of the convex portions 92 and 94 are covered with the above-mentioned divided members of the second sheet-like-member 70.

Each wiring 76 of one subgroup extends along the side surface directed in the Y-direction of the convex portion 92, and each wiring 76 of the other subgroup extends along the side surface directed in the Y-direction of the convex portion 94.

In the third embodiment, too, when the movable body 48 is moved leftward in FIG. 13 relative to the first and second plate-like bodies 44 and 46, the convex member 64 is elastically deformed, thereby pressing the wiring 76 against the wiring 72.

In the foregoing third embodiment, contrariwise, it is possible to place the convex portion 94 in the second plate-like body 46, or to place the convex member 64 on the upside of the ceramic base plate 28.

In the foregoing third embodiment, too, the first sheet-like member 68 may be divided into two members in the vicinity of the boundary of the two main groups of the wiring 72 (vicinity of the lower end of the first convex member 64).

In any case, in the third embodiment, the member having the wirings 72 and 76 of the one main group may be omitted.

Fourth Embodiment

Figure 14:
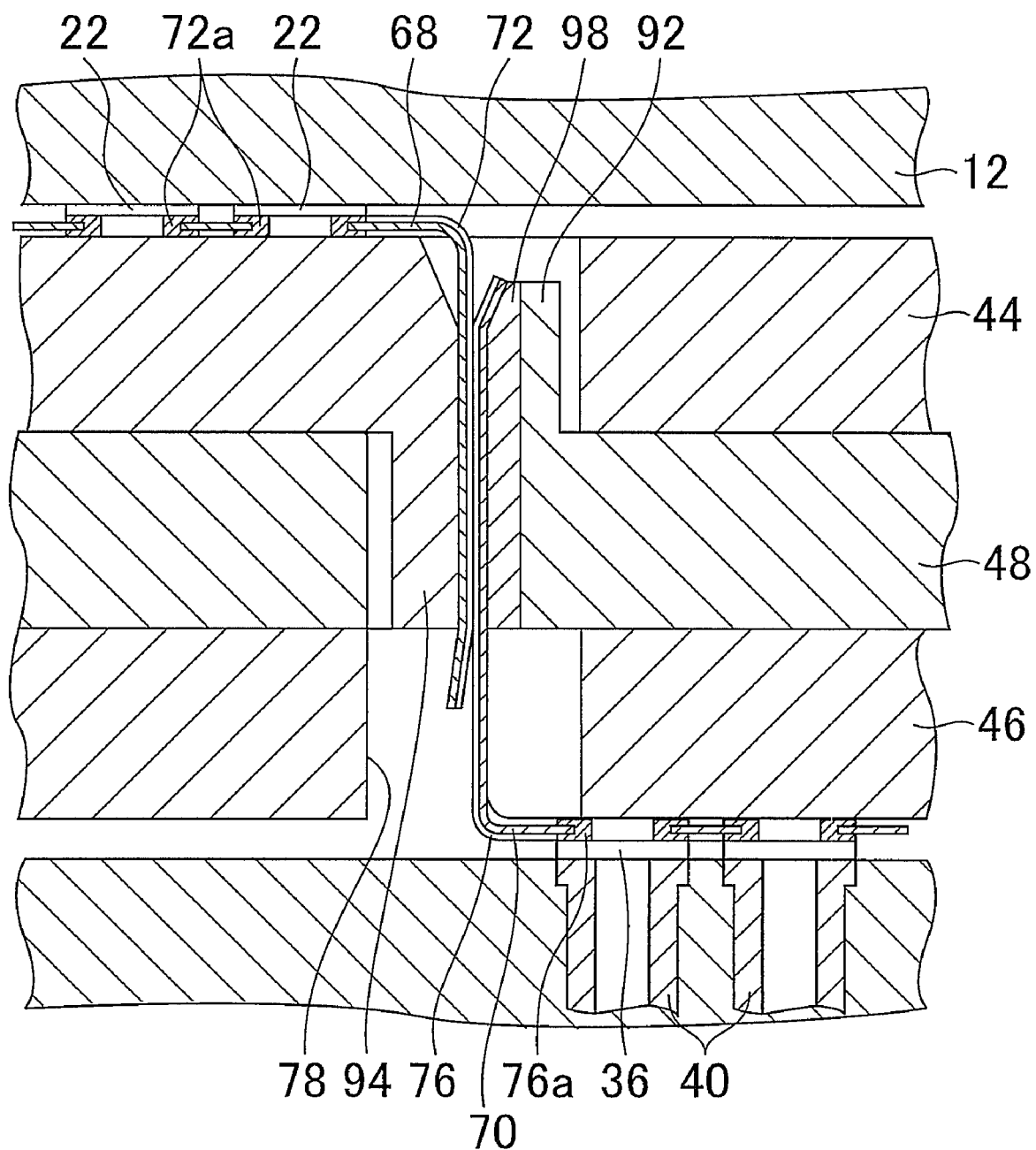
FIG. 14 is a sectional view similar to FIG. 11, showing the fourth embodiment of the electrical connecting apparatus according to the present invention.

Referring to FIG. 14, in the fourth embodiment, the convex member 64 in the third embodiment shown in FIG. 13 is omitted. Thus, the first and second sheet-like members 68 and 70 are respectively provided with a region having the wirings 72 and 76 of the one subgroup, but the region having the wirings 72 and 76 of the other subgroup is omitted.

The first and second sheet-like members 68 and 70 cover the opposing surfaces of the convex portions 94 and 92, and the wirings 72 and 76 respectively extend along the opposing surfaces of the convex portions 94 and 92.

Each wiring 72 of the one subgroup extends along the side surface directed in the Y-direction of the convex portion 94, and each wiring 76 of the other subgroup extends along the side surface directed in the Y-direction of the convex portion 92.

A plate-like elastic member 98 such as rubber is disposed on the above-mentioned side surface of the convex portion 92 and is covered with the sheet-like member 70. Such elastic member 98 may be provided on at least one of the pair of inner surfaces directed in the Y-direction of the slot 78 in FIG. 12, or may be provided in the convex portion 92 or 94 in FIG. 13.

In the fourth embodiment, too, when the movable body 48 is moved leftward in FIG. 14 relative to the first and second plate-like bodies 44 and 46, the elastic member 98 is elastically deformed to press the wiring 76 against the wiring 72.

In the foregoing fourth embodiment, contrariwise, the convex portion 94 may be disposed in the second plate-like member 46.

The present invention is not limited to the foregoing embodiments but can be varied without departing from the purport.

What is claimed is:

1. An electrical connecting apparatus, comprising:
a wiring base plate having a first surface with a plurality of first conductive portions;
a probe base plate having a second surface with a plurality of second conductive portions, the second surface being opposed to said first surface;
a plurality of screw members for removably coupling said wiring base plate and said probe base plate; and
a connecting device for electrically connecting said first and second conductive portions;
wherein said connecting device includes:
a first sheet-like member provided on one surface with a plurality of first wirings electrically connected to said first conductive portion, the first sheet-like member being disposed such that said first wirings extend in a first direction intersecting said first and second surfaces between said wiring base plate and said probe base plate;
a second sheet-like member provided on one surface with a plurality of second wirings electrically connected to said second conductive portion, the second sheet-like member being disposed such that said second wirings are opposed to said first wirings and extend in the first direction between said wiring base plate and said probe base plate; and a pressing device for displacing said first and second sheet-like members relatively between said wiring base plate and said probe base plate in a second direction intersecting said first direction within a plane parallel to said first and second surfaces and relatively pressing said first and second wirings.

2. The electrical connecting apparatus claimed in claim 1, wherein said connecting device includes:

a first plate-like body disposed on said first surface;

a second plate-like body disposed on said second surface;

a plate-like movable body movably disposed between said first and second plate-like bodies in said second direction; and a presser for moving said movable body in said second direction relative to said first and second plate-like bodies;

wherein each of said first plate-like body, said second plate-like body and said movable body has a slot portion forming a slot in cooperation, said slot extending in said third direction intersecting said first and second direction between said first and second surfaces; and wherein said first and second wirings extend in said first direction and are contacted to each other.

3. The electrical connecting apparatus claimed in claim 2, wherein said connecting device further includes:

a first convex member disposed on said first surface to project from said first surface into said slot, the first convex member extending in said third direction; and a second convex member disposed on said second surface to project from said second surface into said slot, the second convex member extending in said third direction;

wherein either one of said first and second convex members is received into a combined groove provided on the other of said first and second convex member, the combined groove extending in said third direction so as to receive either one of said first and second convex members and having an inner surface directed to either one of said first and second convex members;

wherein either one of said first and second wirings extend along two side surfaces of either one of said first and second convex members and facing said inner surface of said combined groove; and wherein the other of said first and second wirings extends along said inner surface of said combined groove.

4. The electrical connecting apparatus claimed in claim 2, wherein said second sheet-like member has a slit between said wirings which is within said combined groove and adjoin in said third direction.

5. The electrical connecting apparatus claimed in claim 3, wherein either one of said first and second sheet-like members covers either one of said first and second convex members; and wherein the other of said first and second sheet-like members covers the side surface of the other of said first and second convex members and the inner surface of said combined groove, the inner surface facing either one of said first and second convex members.

6. The electrical connecting apparatus claimed in claim 2, wherein said connecting device further includes a convex member disposed on either one of said first and second surfaces, the convex member projecting from either one of said first and second surfaces into said slot and extending in said third direction;

wherein either one of said first and second wirings extends along at least one of two side surfaces of said convex member, the two side surfaces facing the inner surface of said slot, and said inner surface being directed in said second direction; and wherein the other of said first and second wirings extends along at least one of two inner surfaces of said slot, said two inner surfaces being directed said convex member.

7. The electrical connecting apparatus claimed in claim 6, wherein either one of said first and second wirings further extends along the other of said two side surfaces of said convex member; and wherein the other of said first and second wirings further extends along the other of said two inner surfaces of said slot.

8. The electrical connecting apparatus claimed in claim 7, wherein the other of said first and second sheet-like members has a member covering one of said two inner surfaces and a member covering the other of said two inner surfaces of said slot.

9. The electrical connecting apparatus claimed in claim 2, wherein said connecting device further includes a convex member disposed on either one of said first and second surfaces to project from either one of said first and second surfaces into said slot, the convex member extending in said third direction;

wherein either one of said movable body, said first sheet-like body and said second sheet-like body has a convex portion projecting into said slot and extending in said third direction;

wherein either one of said first and second wirings extends along at least one of two side surfaces of said convex member, said two side surfaces facing said convex member; and wherein the other of said first and second sheet-like members extends along a side surface of said convex portion, the side surface facing said convex member.

10. The electrical connecting apparatus claimed in claim 2, wherein said movable body has a first convex portion projecting into either one of the slot portions of said first and second plate-like bodies to extend in said third direction;

wherein either one of said first and second plate-like bodies has a second convex portion projecting into the slot portion of said movable body through either one of the slot portions of said first and second sheet-like bodies, the second convex extending in said third direction;

wherein either one of said first and second wirings extends along said convex member; and wherein the other of said first and second wirings extends along a side surface of said first and second convex portions.

11. The electrical connecting apparatus claimed in claim 10, wherein the other of said first and second sheet-like members has a member covering one of said first and second convex portions and a member covering the other of said first and second convex portions.

12. The electrical connecting apparatus claimed in claim 11, wherein said movable body has a first convex portion projecting into either one of slot portions of said first and second plate-like bodies, the first convex portion extending along said third direction;

wherein either one of said first and second plate-like bodies has a second convex portion projecting into the slot portion of said movable body through either one of the slot portions of said first and second plate-like bodies, the second convex portion extending in said third direction;

wherein either one of said first and second wirings extends along a side surface of said first convex portion and facing said second convex portion; and wherein the other of said first and second wirings extends along a side surface of said second convex portion and facing said first convex portion.

13. The electrical connecting apparatus claimed in claim 10, wherein said first or second convex portion is provided with an elastic member disposed on its side surface.

14. The electrical connecting apparatus claimed in claim 2, wherein either one of said movable body, said first plat-like body and said second plate-like body has a convex portion projecting into either one of slot portions of said first and second plate-like bodies, the convex portion extending in said third direction, or a convex portion projecting into the slot portion of said movable body through either one of slot portions of said first and second plate-like bodies, the convex portion extending in said third direction;

wherein either one of said first and second wirings extends along a side surface of said convex portion and facing in said third direction;

wherein the other of said first and second wirings extends along an inner surface of either one of the remaining slot portions of said movable body, said first plate-like body and said second plate-like body, the inner surface facing said convex portion.

15. The electrical connecting apparatus claimed in claim 14, wherein said convex portion is provided with an elastic member disposed on its side surface.

* * * * *